(12) United States Patent
Nielsen

(10) Patent No.: US 7,323,912 B2
(45) Date of Patent: Jan. 29, 2008

(54) HALF-BRIDGE DRIVER AND POWER CONVERSION SYSTEM WITH SUCH DRIVER

(75) Inventor: Ole Neis Nielsen, Frederiksberg (DK)

(73) Assignee: Bang & Olufsen ICEPower A/S, Lyngby (DK)

( * ) Notice: Subject to any disclaimer, the term of this patent is extended or adjusted under 35 U.S.C. 154(b) by 299 days.

(21) Appl. No.: 10/499,194

(22) PCT Filed: Dec. 5, 2002

(86) PCT No.: PCT/IB02/05152

§ 371 (c)(1),
(2), (4) Date: Jan. 14, 2005

(87) PCT Pub. No.: WO03/055072

PCT Pub. Date: Jul. 3, 2003

(65) Prior Publication Data

US 2005/0122754 A1 Jun. 9, 2005

(30) Foreign Application Priority Data

Dec. 21, 2001 (SE) ................. 0104400-7

(51) Int. Cl.
*H03K 3/02* (2006.01)
*H03K 3/36* (2006.01)
(52) U.S. Cl. .................. 327/108; 326/83; 327/333
(58) Field of Classification Search ............. 327/108, 327/109, 198, 319, 333, 382, 384; 326/63, 326/68, 83
See application file for complete search history.

(56) References Cited

U.S. PATENT DOCUMENTS

| 5,105,099 A | 4/1992 | Routh et al. |
| 5,283,477 A * | 2/1994 | Shibata ................. 327/306 |
| 5,514,981 A | 5/1996 | Tam et al. |
| 5,589,798 A | 12/1996 | Harvey |
| 6,353,345 B1 * | 3/2002 | Yushan et al. ............. 327/112 |

FOREIGN PATENT DOCUMENTS

| EP | 0 435 390 A2 | 7/1991 |
| WO | WO 01/75941 A2 | 3/2001 |

* cited by examiner

*Primary Examiner*—Gary L Laxton
(74) *Attorney, Agent, or Firm*—Harness, Dickey & Pierce, P.L.C.

(57) ABSTRACT

A half-bridge driver includes first and second power switches, connected with their respective current paths in series, a pulse generator for generating a voltage pulse waveform, arranged to drive the first power switch, a first current generator for generating a current pulse for each negative flank of the voltage pulse waveform, a second current generator for generating a current pulse for each positive flank of said voltage pulse waveform, and a differential current receiver circuit. The differential current receiver circuit is connected to the first and second current generators, and is arranged to generate an output signal equal to the difference of the currents flowing through the current generators. The output signal is arranged to drive the second power switch.

17 Claims, 4 Drawing Sheets

US 7,323,912 B2

HALF-BRIDGE DRIVER AND POWER CONVERSION SYSTEM WITH SUCH DRIVER

TECHNICAL FIELD

The present invention relates to a half-bridge power stage driver, comprising first and second power switches, connected with their respective current paths in series, a pulse generator for generating a voltage pulse waveform, arranged to drive said first power switch, a first current generator, for generating a current pulse for each trailing edge of said voltage pulse waveform, and a second current generator, for generating a current pulse for each leading edge of said voltage pulse waveform.

The invention can advantageously be used in power conversion systems where high-speed operation combined with low power consumption is required as e.g. motor drive and in particular in power amplification for audio use.

TECHNICAL BACKGROUND

A half-bridge is a power converter comprising two power switches, e.g. transistors, one referred to as the low side transistor, and the other referred to as the high side transistor. Each transistor is driven by separate drive circuits, i.e. a low side driver and a high side driver.

In the art well known controlling systems for a high side driver comprise a pulse technique, where narrow set and reset current pulses are transmitted to the high side driver, in which a latch is placed to restore the original control signal. Such a system is known from U.S. Pat. No. 5,514,981 "Reset dominant level-shift circuit for noise immunity" and U.S. Pat. No. 5,105,099 "Level shift circuit with common mode rejection".

In pulse control a major problem is common mode dv/dt induced currents in the current paths of the set and reset nodes, arising from parasitic capacities in current pulse generators. The dv/dt at the output terminal (offset voltage) of the output stage can reach very high levels—thus even very small parasitic capacitances will result in dv/dt common mode currents. The common mode noise can cause false operation of the output switch, resulting in shoot-through in the power stage.

Conventionally, the current pulses have been converted into voltage pulses in the high side driver by means of two pull up resistors. This approach does not in it self provide any common mode rejection and additionally circuits have been mandatory.

One way of solving problems due to common mode noise has been to add low pass filtering combined with adjustment of thresholds of the set/reset levels in order to obtain a reset dominant function, leading to a more predictable operation. Unfortunately this approach compromises speed and power efficiency because of the low pass filtering, which calls for an increase of the width of the current pulses.

Another approach has been to add logic circuitry after said pull up resistors to suppress common mode signals; this however involves a substantial amount of gate circuitry.

Lowering of the power consumption in the driver to achieve high efficiency in the system can be obtained by lowering the gate drive voltage, preferably to logic level (5 Volt). By doing so the speed performance of the system is also increased. Reducing the gate drive voltage also reduces the noise margin for the voltage drop over the pull up resistors. Therefore level shift circuits based on pull up resistors are challenged when the load terminal is negative with respect to ground. This is caused by the fact that the voltage drops over the pull up resistors are limited which can course false operation of the MOSFET's. The situation of negative load terminal voltage occurs in situations of ringing and when the body-diode in the low side MOSFET of the half bridge is conducting.

In general, the use of pull up resistors is not suitable for logic level driver voltage because of the negative load terminal voltage that must be expected to compromise the logic level of the high side set/reset inputs.

OBJECTS OF THE INVENTION

An object of the present invention is to provide a novel system for receiving and handling the set and reset current pulses in a high side driver, thereby obtaining reliable operating conditions for operating the power switching transistors.

A second object of the invention is to provide a half-bridge driver with cancellation of common mode currents.

SUMMARY OF THE INVENTION

These and other objects are achieved by a half bridge driver of the kind mentioned by way of introduction, further comprising a differential current receiver circuit, having at least one low impedance current buffer connected to said first and second current generators, said differential current receiver circuit arranged to generate an output signal equal to the difference of the currents flowing through said current generators, said output signal arranged to drive said second power switch.

According to a preferred embodiment, the set and reset current pulses are received by low impedance non-inverting and inverting current buffers respectively. The output of these buffers are then connected and summed. When summating the common mode noise currents induced by the dv/dt in the set and reset current paths, one current will be inverted so that the currents cancel, and false triggering is prevented.

According to the invention, the pulse generated signals stay as currents that are insensitive to capacitances, and also the driver is immune to negative offset voltages. Further, it is now possible to reduce the required drive voltage, thereby reducing power consumption and operating temperatures for the half-bridge driver.

The low impedance inputs result in elimination of voltage swings on the inputs and the dc bias point of these inputs will be as close as possible to the positive power supply of the high side driver. This will enable the level shift to show secure function even for high negative offset voltages because the decision points is no longer based on voltage drops across the prior pull up resistors. This feature is of great benefit in terms of power reduction, because it enables lowering of the operating voltage of the driver. This enables reduction of power dissipation, a reduction of the die size and an increase in the speed performance.

At the output of this summing point a logic buffer with a feedback resistor can be arranged, acting as memory cell. The restored control signal for the gate drive is then found on the-output of the memory cell. The value of the resistor and the threshold of the buffer determine the magnitude of the current for flipping the latch. Thereby, common mode currents are cancelled and common mode rejection of noise is achieved.

BRIEF DESCRIPTION OF THE DRAWINGS

The currently preferred embodiment of the present invention will be further described in the following, with reference to the appended drawings.

DETAILED DESCRIPTION OF THE PREFERRED EMBODIMENTS

Figure 1:
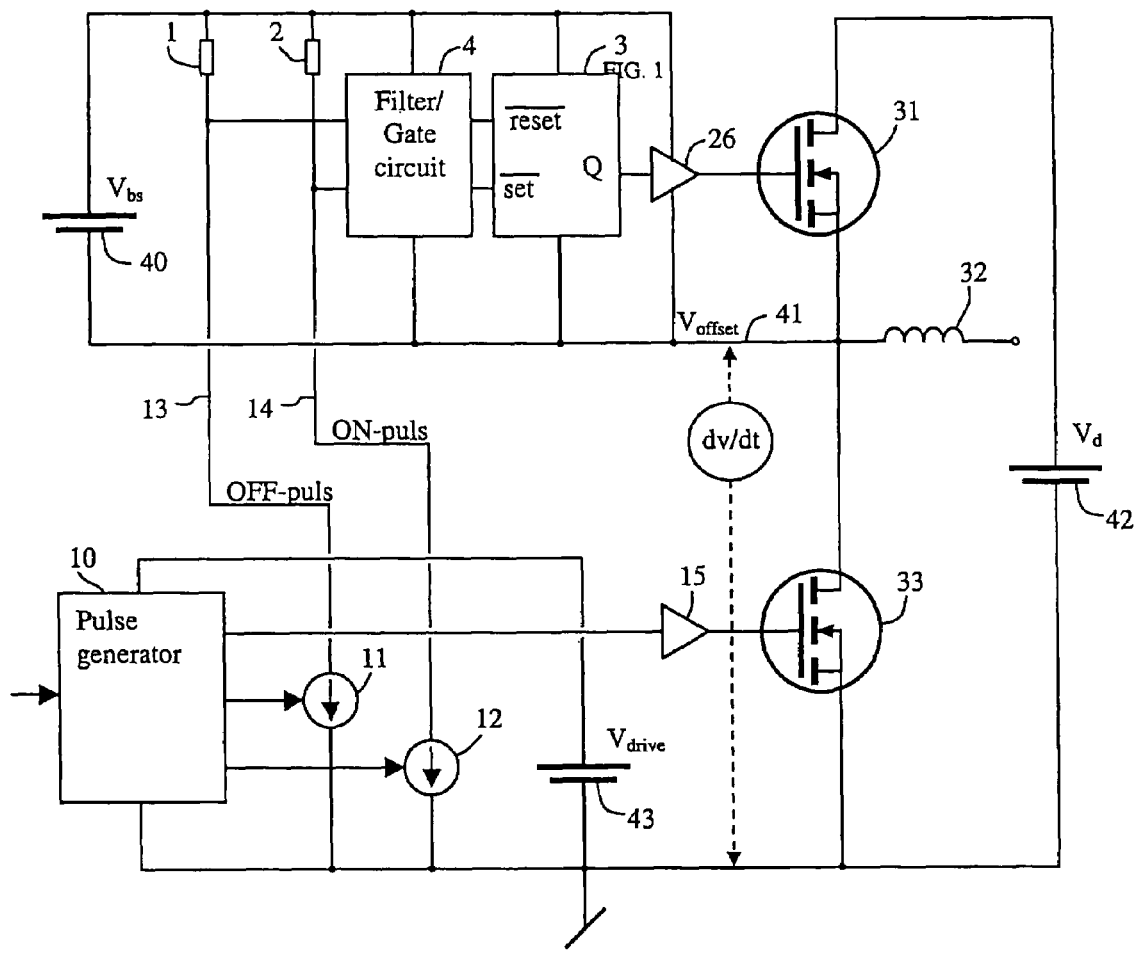
FIG. 1 is a schematic diagram of a prior art implementation of a pulse control of a high side driver.

A topology for an output stage is illustrated in FIG. 1. The driver has two pull-up resistors 1, 2, a filter or gate block 4 for noise rejection, and a latch 3. The system further comprises current generators 11, 12 controlled by a pulse generator 10.

The output stage comprises two N-channel power switches 31 and 33. The load terminal is referred to as $V_{offset}$ 41. The output terminals, 41 and ground or $-V_d$, can drive any type of load, for example an inductive load such as a coil or an electro-dynamic transducer. The offset voltage is also the reference potential for the high-side driver and will under normal operation be 0V or $\pm V_d$ 42. The high side driver is powered from the supply $V_{bs}$ 40 and this voltage preferably equals the supply $V_d$ 42.

Figure 2:
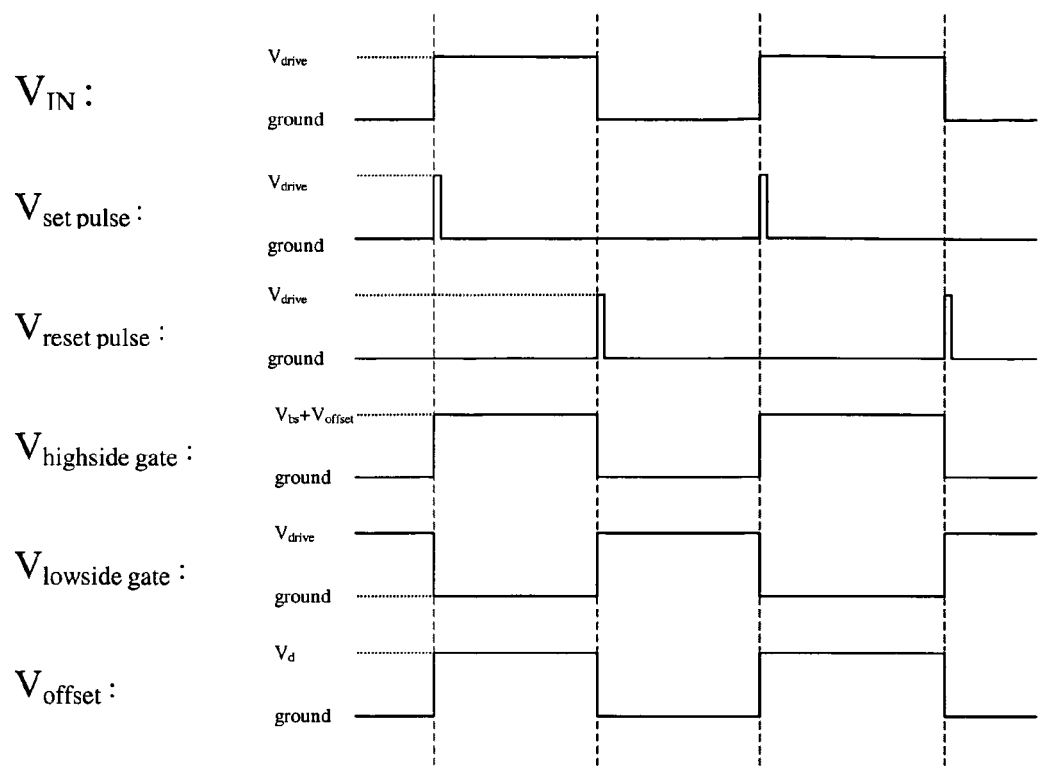
FIG. 2 is a diagram with common time base showing the timing of the system in FIG. 1.

The basic functionality of the known prior art pulse controlled high side driver shown in FIG. 1 is explained in FIG. 2, showing the timing of the system. The current generators 11, 12 generate narrow current pulses at the rising and trailing edges of the voltage pulse waveform generated by the pulse generator 10. This produces narrow voltage pulses over the resistors 1 and 2 for respectively setting and resetting of the latch 3, which through a driver 26 provides a gate control signal for the floating switch device.

Figure 3:
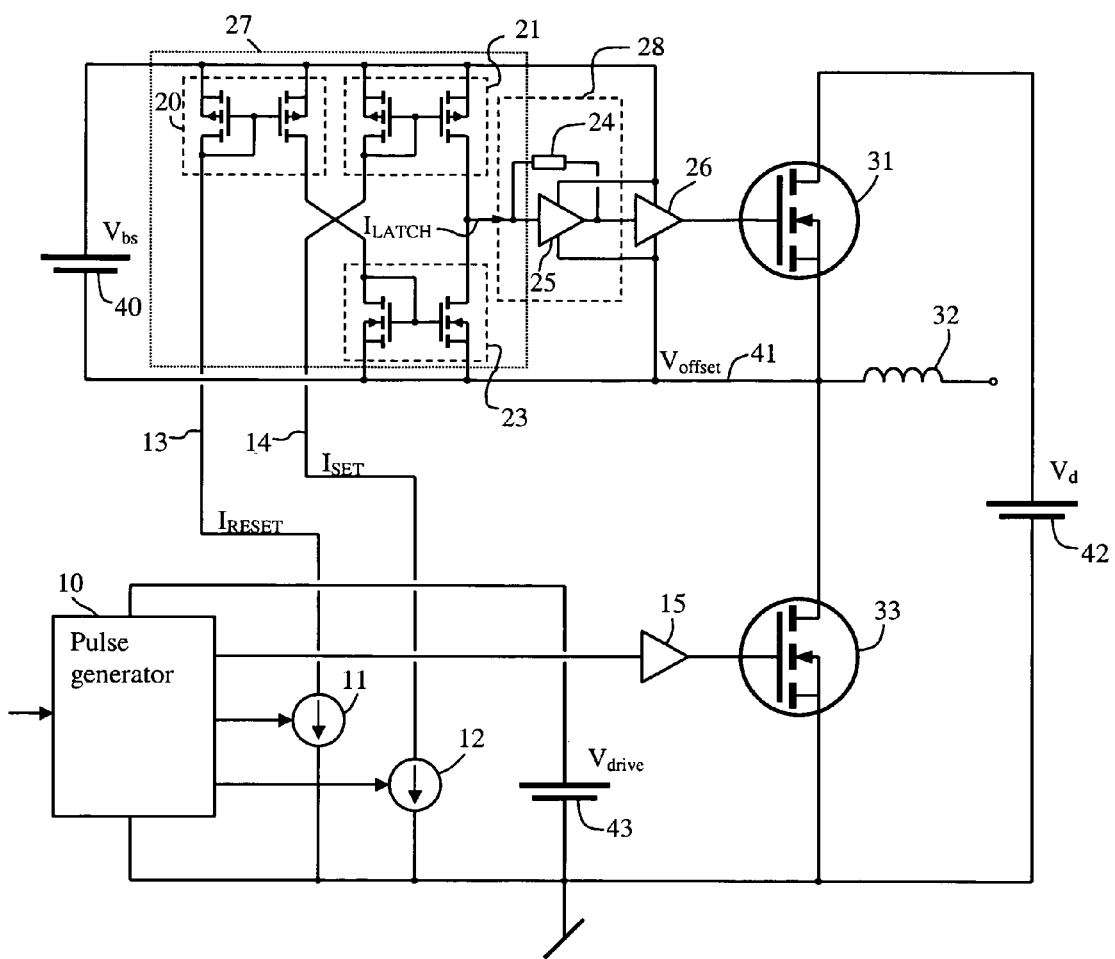
FIG. 3 is a schematic diagram of a half-bridge driver according to a preferred embodiment of the invention.

The first preferred embodiment of the invention is shown in FIG. 3, where components similar to the components in FIG. 1 have been given identical reference numerals. The current generators 11, 12 and the pulse generator 10 can be implemented as any given generator topology. The power switches 31 and 33 can be any type of transistor, preferably a type of transistor optimized for operating in an "on" or "off" state such as a Field Effect Transistor. The power supply $V_d$ 42 as shown in FIG. 3 is a single (+ and reference to ground) voltage power supply. The circuit nodes fixed to ground can be replaced by negative supply circuit nodes so that the low side driver uses the negative supply as a reference and a dual ($\pm$) $V_d$ supply 42 can be used.

Further, the half-bridge driver in FIG. 3 comprises a current receiver circuit 27, having a plurality of low impedance input current buffers. In the illustrated example, these low impedance current buffers are implemented as current mirrors 20, 21, 23, based on MOSFET transistors. The current buffers 20, 21, 23 are connected to the voltage supply $V_{bs}$ according to FIG. 3.

The driver also includes a memory cell 28, comprising a logic buffer 25 and a positive feedback resistor 24, connected to the driver 26. The current generators 11, 12 are connected to the mirrors 20 and 21 respectively, while the mirrors 21 and 23 are connected to the memory cell 28.

In operation, voltage pulse waveforms are generated by the pulse generator 10 and transformed into current pulses by current generators 11 and 12. The first current generator 11 generates a pulse $I_{RESET}$ for each trailing edge of the voltage pulse, while the second current generator 12 generates a pulse $I_{SET}$ for each leading edge of the voltage pulse. These current pulses are received by the current mirrors 20 and 21 respectively, in the current receiver circuit 27. The mirrored reset current pulse $I_{RESET}$ is supplied from the current mirror 20 to the current mirror 23, where it is again mirrored. Finally, the outputs from current mirrors 21 and 23 are summed at the input terminal of the buffer 25.

By this topology the signals stay as currents and the offset voltages can now rise to approximately $V_{BS}-1V$, before the level shift looses its functionality. If the offset voltage should rise to a level where the current generators are not able to deliver the necessary current, the level shift will not be able to turn the high side switch on, thus preventing fatal shoot through. Secondly, it is now possible to reduce the preferably equal voltages $V_{BS}$ and $V_{drive}$ to as low as 5 volts or even lower, thereby gaining considerably power savings. This will contribute to lower operating temperatures for the half-bridge driver.

Figure 4:
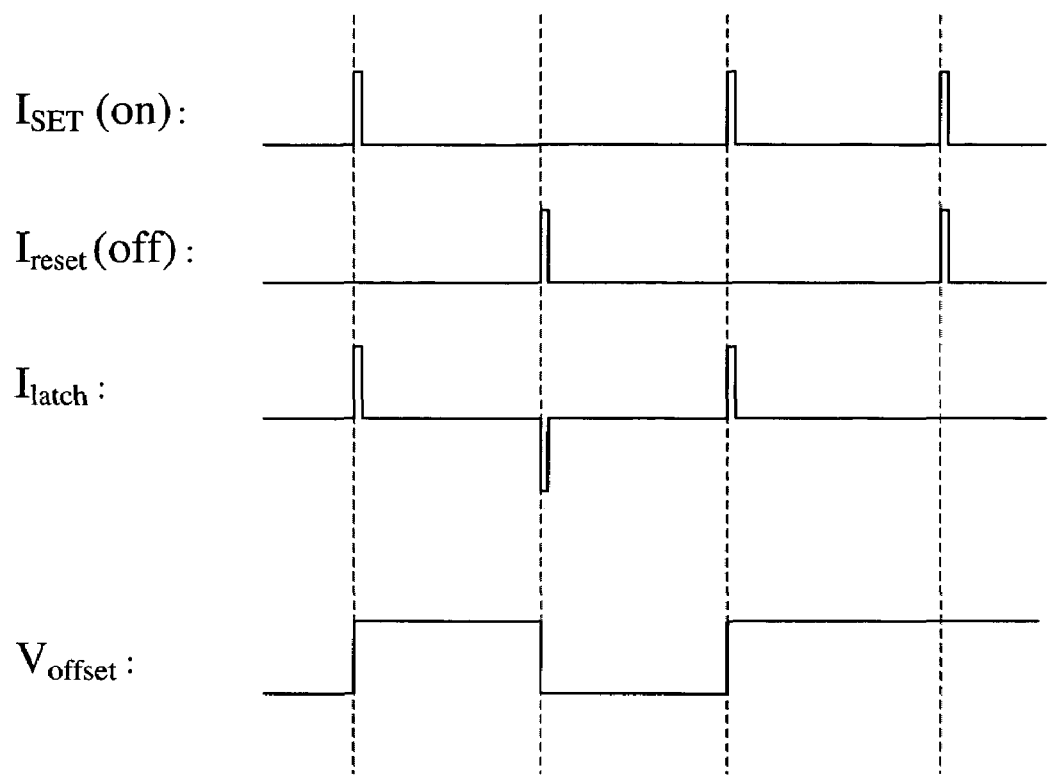
FIG. 4 is a diagram showing the current pulses in the system in FIG. 3.

With reference to the diagrams in FIG. 4, the set current pulse $I_{SET}$ causes a current pulse of same magnitude and direction in the point referred to as $I_{LATCH}$ in FIG. 3. The current flows into the memory cell 28. Said $I_{LATCH}$ current is converted into a voltage across the positive feedback resistor 24, causing the memory cell 28 to go into high state. When a reset current pulse $I_{RESET}$ is received, a current of same magnitude but opposite direction will flow in the positive feedback resistor 24, resulting in a reset of the memory cell.

With continuing reference to FIG. 4, an example of a common mode noise situation is illustrated as a set and reset pulse occurring at the same time. In this situation these two currents simply cancel each other obtaining common mode current rejection. This is obtained since the current flowing through the feedback resistor 24 is zero, therefore there will not be a voltage drop across it.

The half-bridge driver can be implemented in any given power conversion system comprising a half-bridge of transistors such as DC-DC, AC-AC, DC-AC, AC-DC power conversion systems or any combination of the above mentioned. In particular the half-bridge driver can be implemented in high precision DC-AC power conversion systems comprising one or a plurality of half-bridges and one or a plurality of half-bridge drivers.

The half-bridge driver can be implemented on silicon thus reducing size and increasing performance in terms of speed and precision of the half-bridge driver.

The invention claimed is:

1. A half-bridge driver, comprising:
    first and second power switches, connected with their respective current paths in series;
    a pulse generator for generating a voltage pulse waveform, arranged to drive said first power switch;
    a first current generator for generating a first current signal including a current pulse for each negative flank of said voltage pulse waveform;
    a second current generator for generating a second current signal including a current pulse for each positive flank of said voltage pulse waveform; and
    a differential current receiver circuit, connected to said first and second current generators, and arranged to generate an output current signal equal to the difference of said first and second current signals generated by said current generators, said output current signal arranged to drive said second power switch.

2. A half bridge driver according to claim 1, wherein said differential current receiver circuit comprises at least one low impedance current buffer.

3. A half bridge driver according to claim 1, wherein said differential current receiver circuit comprises three low impedance current buffers.

4. A half-bridge driver according to claim 2, wherein at least one of said current buffers is a current mirror circuit.

5. A half-bridge driver according to claim 1, further comprising a memory cell having a buffer and a feedback resistor, said memory cell being connected to said output signal.

6. A half-bridge driver according to claim 1, wherein said power switches are transistors.

7. A half-bridge driver according to claim 1, further comprising two voltage sources.

8. A half-bridge driver according to claim 1, further comprising logic level voltage operation, with a logic level voltage of 0-5 volt.

9. A half-bridge driver according to claim 1, implemented on silicon substrates.

10. A power conversion system for driving an inductive load, comprising a half-bridge driver according to claim 1.

11. A power conversion system comprising a plurality of half-bridge drivers according to claim 1.

12. A power conversion system according to claim 10, used for DC-AC audio power conversion.

13. A half-bridge driver according to claim 3, wherein at least one of said current buffers is a current mirror circuit.

14. A half-bridge driver according to claim 1, wherein said power switches are Field Effect Transistors.

15. A half-bridge driver according to claim 7, wherein the two voltage sources deliver the same magnitude of voltage.

16. A power conversion system according to claim 11, used for DC-AC audio power conversion.

17. A half-bridge driver according to claim 1, further comprising:
- a first low impedence inverting current buffer arranged to receive said first current signal;
- a second low impedence non-inverting current buffer arranged to receive said first current signal; and
- a third low impedence inverting current buffer arranged to receive outputs from said first and second current buffers and output said output current signal.

* * * * *